United States Patent [19]
Miyasaka et al.

[11] Patent Number: 5,372,958
[45] Date of Patent: Dec. 13, 1994

[54] PROCESS FOR FABRICATING A THIN FILM SEMICONDUCTOR DEVICE

[75] Inventors: Mitsutoshi Miyasaka; Thomas W. Little, both of Suwa, Japan

[73] Assignee: Seiko Epson Corporation, Tokyo, Japan

[21] Appl. No.: 792,436

[22] Filed: Nov. 15, 1991

[30] Foreign Application Priority Data

Nov. 16, 1990 [JP] Japan ................................. 2-310477
Apr. 9, 1991 [JP] Japan ................................. 3-76406
Sep. 13, 1991 [JP] Japan ................................. 3-235098

[51] Int. Cl.$^5$ .......................................... H01L 21/265
[52] U.S. Cl. ......................................... 437/40; 437/28; 437/247; 437/913; 148/DIG. 150
[58] Field of Search ................. 437/40, 28, 913, 247; 148/DIG. 83, DIG. 150, DIG. 76, DIG. 118

[56] References Cited

U.S. PATENT DOCUMENTS

4,859,908  8/1989  Yoshida et al. ................. 204/298.37
5,141,885  8/1992  Yoshida et al. ........................ 437/37

FOREIGN PATENT DOCUMENTS

63-58875  3/1988  Japan .
0282577  3/1990  Japan .
3104209  5/1991  Japan .

OTHER PUBLICATIONS

Hatalis et al. "High-Performance Thin Film Transistors in Low Temperature Crystallized by LPCVD Amorphous Silicon Films"; IEEE Electron Device Letter, 8(8), Aug. 1987, pp. 361–364.
Thomas W. Little, et al.; Low Temperature Poly-Si TFTs Using Solid Phase . . . The Japan Society of Applied Physics 30L 84; üL91 pp. 644–646, (1991).

Primary Examiner—Brian E. Hearn
Assistant Examiner—Michael Trinh
Attorney, Agent, or Firm—Spensley Horn Jubas & Lubitz

[57] ABSTRACT

There is Disclosed a semiconductor device comprising a silicon film formed on a substrate having at least a surface formed of an insulative material, the silicon film being heat-treated at a temperature below 600° C. and being partially coated with a silicon oxide film formed by electronic cyclotron resonance plasma CVD.

2 Claims, 10 Drawing Sheets

PROCESS FOR FABRICATING A THIN FILM SEMICONDUCTOR DEVICE

BACKGROUND OF THE INVENTION

1. Field of the Invention

This invention relates to thin film semiconductor devices fabricated on insulative substances, such as thin film transistors, three-dimensional LSI devices, etc., which are applied to active matrix liquid crystal displays, etc., to a process for fabricating the devices, and silicon films. Specifically this invention relates to a process for fabricating a thin film semiconductor device by low-temperature processing the steps of which are conducted at a maximum temperature equal to or lower than about 600° C.

2. Related Background Art

Recently, accompanying the enlargement of screens of liquid crystal displays, and increases of their resolutions, the driving method for liquid crystal displays has changed from the simple matrix method to the active matrix method, and increasingly larger volumes of information can be displayed. The active matrix method enables a liquid crystal display to have more than hundred thousands of picture elements, and has one switching transistor for each picture element. As substrates for such liquid crystal displays, transparent insulative substrates, such as fused quartz plates, glass or others, which enable transparent-type displays to be obtained.

But in order to advance the enlargement of the display screen and its price reduction it is essential to use inexpensive ordinary glass as an insulative substrate. In these circumstances, a process for fabricating thin film transistors for operating an active matrix liquid crystal display on an inexpensive glass substrate with high performance, retaining this economy has been required.

As the channel semiconductor layer of a thin film transistor, usually amorphous silicon or polycrystalline silicon is used, but polycrystalline silicon, which has higher operational speed, is more advantageous for the case that a thin film transistor is integrated up to the driving circuit.

Conventionally in fabricating such thin film transistor, thermal oxidation has been used to form a gate insulating layer. That is, to form the gate insulating layer after the formation of a channel silicon layer, a substrate is inserted into an oxidizing ambient atmosphere containing oxygen, ($O_2$), laughing gas ($N_2O$), vapor ($H_2O$), etc. to raise its temperature to 800°—about 1100° C. and partially oxidize the channel silicon layer. On the other hand, various processes have been tried in fabricating thin film semiconductor devices using polycrystalline silicon at maximum processing temperatures below about 600° C. at which inexpensive ordinary glass can be used. They are exemplified by the process in which a channel semiconductor layer is formed as-deposited polycrystalline silicon which is prepared by low pressure chemical vapor deposition (LPCVD) with the deposition temperature of about 600° C. or more, and then a gate insulating film is formed by electronic cyclotron resonance plasma CVD (ECR-PECVD) and is further subjected to hydrogenation by e.g., hydrogen plasma radiation. They are also exemplified by the process in which an amorphous silicon thin film is deposited on a channel semiconductor layer, then is heat-treated for about 24 hours at 600° C., and then a gate insulating film is formed by atmospheric pressure chemical vapor deposition (APCVD) and is subjected to hydrogen treatment (Japanese J. Appl. Phys. 30L 84, üL91).

But a number of problems have been pointed out with the above-described prior art processes. Firstly, a problem with the formation of a $SiO_2$ film by thermal oxidation is the heat resistance of thin film layers and a substrate below the oxide film because the formation of the oxide film involves heat treatment at a high temperature above 800° C. For example, in the fabrication of switching transistors for a large screen liquid crystal display, nothing other than very expensive fused quartz can stand the high temperatures. In three-dimensional LSI devices as well, this thermal oxidation cannot be practically used because the lower layer transistors are deteriorated by the high temperatures.

Next, a problem with the process in which a channel semiconductor layer is formed by LPCVD as-deposited poly-crystalline silicon, and a gate insulating film is formed by ECR-PECVD and is further subjected to hydrogen plasma treatment is that the resultant thin film semiconductor has a mobility as low as 4–5 $cm^2/v \cdot sec$., which is so far insufficient for thin film semiconductor devices. In addition, this hydrogenation treatment, which is conducted for the improvement of properties of the thin film semiconductor device, etches parts of the various thin films thereof, with the adverse result that some of a number of the thin film semiconductor devices are broken. A problem with the process in which an amorphous silicon thin film is deposited as a channel semiconductor layer and is subjected to heat treatment at about 600° C., and then a gate insulating film is formed by APCVD and is subjected to hydrogenation treatment by hydrogen plasma radiation or others is that the resultant thin film semiconductor device has an interface trap level as high as about $10^{12}$, and exhibits properties of the depletion-type semiconductor device, which is so far insufficient for the thin film semiconductor device. In addition, the same problem as that involved in the hydrogenation treatment in the previous process is still unsolved, with the adverse result that thin film semiconductor devices cannot be fabricated homogeneously and stably on a large area.

In these circumstances has been expected a thin film semiconductor device which has a high mobility and, on the other hand, a clean MOS interface and a low interface trap level, and does not exhibit depletion, and a process which can fabricate such thin film semiconductor devices having these advantages homogeneously and stably on a large area and is free from the hydrogenation treatment in the fabricating steps of such thin film semiconductor devices.

SUMMARY OF THE INVENTION

This invention has been made in view of these circumstances, and an object of this invention is to provide a MIS thin film semiconductor device including a semiconductor device which is fabricated by low-temperature processing whose maximum processing temperature is below about 600° C., and has good semiconductor properties, and a process for fabricating such thin film semiconductor devices homogeneously and stably on a large area.

It is another object of the present invention to provide a semiconductor device comprising a silicon film formed on a substrate having at least a surface formed of an insulative material, the silicon film being heat-treated at a temperature below 600° C. and being partially coated with a silicon oxide film formed by electronic cyclotron resonance plasma CVD.

It is more another object of the present invention to provide process for fabricating a semiconductor device in a MIS field-effect transistor including a channel region formed on one face of a substrate having at least a surface formed of an insulative material, a source region and a drain region, and a gate electrode opposed to the channel region through a gate insulating layer the semiconductor device having at least either of the source and the gate the regions not superposed on the gate electrode through the gate insulating film, the process comprising the step of forming a silicon film constituting a channel silicon film semiconductor layer, and the step of forming the source and the drain regions; and the step of heat-treating at a temperature below 600° C. the substrate with the channel region, and the source and the drain regions formed on.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

BRIEF DESCRIPTION OF THE DRAWINGS

FIG. 8 is a view explaining an effect of this invention;

DESCRIPTION OF THE PREFERRED EMBODIMENT

EXAMPLE 1

Figure 1A:
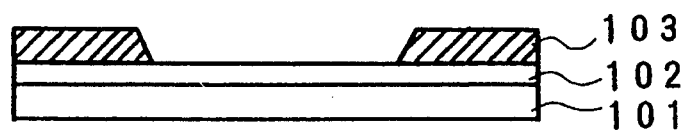
FIGS. 1A to 1E show sectional views of the silicon thin film semiconductor device according to an example of this invention in the respective fabrication steps.
Figure 1B:
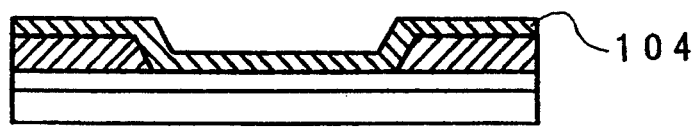

Examples of this invention will be explained with reference to the drawings attached hereto, but this invention is not limited to the examples.

FIGS. 1A to 1E are sectional views showing the steps of fabricating a silicon thin film semiconductor device constituting a MIS field-effect transistor of a non-self-aligned staggered structure according to Example 1 of this invention.

In Example 1 a substrate 101 was a 235 mm-square fused quartz glass. But the substrate may be a material of any kind and size as long as the material can stand a maximum processing temperature of 600° C. For example, in addition to ordinary glass substrates, semiconductor substrates, as of silicon wafers, LSIs and three-dimensional LSIs, which are processed products of silicon wafers, and ceramic substrates, such as silicon carbide, alumina, aluminum nitride, etc. can be used.

The substrate 101 was immersed for ultrasonic cleaning in an organic solvent, such as methyl ethyl ketone, methylisobutyl ketone, cylohexane or others. Following this cleaning, the substrate was dried in nitrogen or under a reduced pressure, then was ultrasonic-cleaned by ethanol, and was washed with nitrogen-bubbled pure water. Subsequently the substrate 101 was immersed for 5 minutes in a boiling 60% concentration-nitric acid, and then was washed in nitrogen bubbled pure water. In the case the substrate 101 is, e.g., a metal which is corroded or deteriorated with acids, the cleaning with nitric acid is not necessary. This strong-acid cleaning may use sulfuric acid or others in addition to nitric acid.

On the thus-prepared quartz substrate a silicon oxide film ($SiO_2$) 102 as a protective underlayer film was deposited in a 2000 Å-thickness by atmospheric pressure chemical vapor deposition (APCVD). In the case that the above-mentioned various materials are used as the substrate 101, this $SiO_2$ protective underlayer film 102 is necessary to stabilize the film quality of a silicon thin film to be deposited later thereon, and the performance of a thin film transistor to be formed therein. In the case that the substrate is, e.g., an ordinary glass, the protective underlayer film 102 functions to hinder the diffusion and intrusion of the mobile ions, as of sodium, etc., contained in the glass into the transistor region, or in the case that the substrate 101 is a ceramic plate, the protective underlayer film 102 functions to hinder the diffusion and intrusion of the sintering assistant materials contained in the ceramic substrate into the transistor region. The protective $SiO_2$ film 102 is essential to secure insulation in the case that the substrate 101 is a metal plate. In three- dimensional LSIs, the protective underlayer film 102 corresponds to an inter-layer insulating film, e.g., between transistors or between lines. In depositing the $SiO_2$ film 102, the substrate temperature was kept to 300° C., and 600 SCCM of silane diluted to 20% with nitrogen was used together with 840 SCCM of oxygen in order to deposit $SiO_2$ film by APCVD. The depositing speed of the $SiO_2$ film was 3.9 Å/sec.

Subsequently a silicon thin film 103 containing a dopant as donors or acceptors was deposited by low pressure CVD. Since Example 1 is intended to fabricate an n-transistor, phosphorus was selected as the dopant. But, in place of phosphorus, an element of Groups 5 and 6 can be added as a dopant element for an n-transistor, and for a p-transistor boron or a different element of Groups 2 and 3 can be added as a dopant element. This dopant-added silicon thin film 103 is a part where a source and drain region is to be formed, and in addition to CVD as used in Example 1, the film 103 can be formed by a technique in which an intrinsic silicon film containing no dopant is first formed, and then a dopant is added to the intrinsic silicon film by diffusion in a gas phase, or in a solid phase in contact with the intrinsic silicone film 103; by a technique in which an ionized dopant is implanted into the intrinsic silicon film 103, or by other techniques. These techniques in which the intrinsic silicon film 103 is first formed, and then a dopant is added to the intrinsic silicon film 103 by diffusion or ion implantation enable a dopant to be added to a required part of the intrinsic silicon film 103. Consequently a self-alignment transistor having the gate electrode terminal, the source terminal and the drain terminal self-aligned can be fabricated. It is also possible to change an electric current density and a specific electric resistance in the intrinsic silicon film 103 so as to cause a current to flow through a required part by varying a dopant concentration corresponding to parts.

In Example 1, since phosphorus was used as the dopant, a mixed gas of phosphine ($PH_3$) and silane was used in depositing the doped silicon thin film 103 in a 1500 Å-thickness.

In Example 1, the silicon thin film 103 was deposited by causing 200 SCCM of monosilane, 6 SCCM of the helium-phosphine mixed gas of 99.5% of helium and 0.5% of phosphine, and 100 SCCM of helium to flow into a 184.5 volume-low pressure CVD furnace at a depositing temperature of 600° C. and a furnace interior pressure of 100 mtorr. The depositing rate at this time was 29.6 Å/min., and the sheet resistance immediately after the deposition was 2025 Ω/square.

Subsequently a resist was formed on the silicon thin film 103, and the silicon thin film 103 was patterned with a mixed plasma of carbon tetrafluoride ($CF_4$) and oxygen ($O_2$), and a source and a drain regions 103 were formed (FIG. 1A). Then the thus-fabricated substrate was immersed in boiling nitric acid for 5 minutes to remove residual resist and then immersed in 1.67% -hydrofluoric acid for 20 seconds to remove the natural oxide film on the surfaces of the source and the drain regions 103. Immediately a silicon thin film for a channel region was deposited by low pressure CVD.

At this time, the volume of the low pressure CVD reaction furnace was 184.5l, and the substrate was placed horizontally near the center of the reaction furnace. Raw material gases,,and dilution gases, such as helium, nitrogen, argon, hydrogen, etc., were fed as required from a lower portion of the reaction furnace and exhausted from an upper portion of the reaction furnace. Around the outside of the reaction furnace of quartz there was disposed a heater having three separate zones, so that a iso thermal zone of a required temperature could be formed near the center of the reaction furnace by adjusting the three zones independently. This iso thermal zone spread about 350 mm high, and a temperature difference in this range was within 0.2° C. when the temperature was set at 600° C. When substrates are loaded at a 10 mm-interval, 35 sheets of substrates can be treated. In Example 1, 17 sheets of substrates were loaded in the iso thermal zone with a 20 mm-interval.

The exhaust was performed by a rotary pump, and a mechanical booster pump directly connected to the former, and the pressure in the reaction furnace was measured by a capacitance (Baratron manometer presented by MKS Company), whose measured value does not depend on kinds of Eases. When the reaction furnace was evacuated at 550° C. by both pumps with the gas-feed valve closed, the reaction furnace interior pressure was 0 mtorr, and the degree of background vacuum was below about $10^{-4}$ torr at worst.

Immediately the substrate having the source and the drain regions 103 formed on, and in which the natural oxide films on the surfaces of both regions have been removed was inserted in a low pressure CVD reaction furnace. The reaction furnace interior temperature at the time of the insertion of the substrate was kept at 395° to about 400° C. This temperature was for the purpose of minimizing the formation of natural oxide films on the source and the drain regions 103. It is preferable to keep the reaction furnace interior temperature as low as possible. It is possible to keep the reaction furnace interior temperature at, e.g., the room temperature, but a time exceeding some hours is necessary to raise the furnace interior temperature to a deposition temperature, and to return the depositing temperature to the room temperature after deposition, some hours are also necessary. At the time of the insertion of the substrate into the reaction furnace, about 4–10 SLM of nitrogen was caused to flow in the reaction furnace, keeping the interior in an inert ambient atmosphere. A nitrogen curtain of about 6–20 SLM of nitrogen was formed near the entrance of the reaction furnace, so that the inflow of air at the time of the insertion of the substrate was kept minimum. If moisture in air, or oxygen should enter the reaction chamber, it will be adsorbed on the Si layer of the inside wall of the reaction furnace, or will react with the Si and reside on the furnace. When a silicon film for the channel region is deposited, the moisture or oxygen will be released as gases which will cause degradation of the film quality of the deposited silicon film.

After the insertion of the substrate, the evacuation and a leakage test were conducted. In the leakage test, the reaction furnace was perfectly isolated with all the valves communicating with the reaction furnace closed to check changes of the reaction furnace interior pressure. In Example 1, the reaction furnace interior pressure was below 1 mtorr after 2 minute-isolation at a reaction furnace interior temperature of 400° C. After the leakage test found that there was no abnormalities, the reaction furnace interior temperature was raised from 400° C. to a depositing temperature. In Example 1, a silicon thin film for the channel region was deposited at 550° C., and one hour was taken to raise the reaction furnace interior temperature. Although it takes about 35 minutes for the furnace interior temperature to reach the depositing temperature of 550° C., a temperature-raising period of one hour or more at shortest, preferably of some hours, is preferable also for the purpose of releasing the gases from the furnace wall. During this temperature-raising period, the two pumps were in operation to cause an inert gas or a reductant gas of at least a 99.995% or higher purity to flow. The inert or reductant gas may be a pure gas, such as hydrogen, helium, nitrogen, neon, argon, xenon, krypton or others, or may be their mixed gases. In Example 1, 350 SCCM of helium of a 99.9999% or higher purity was caused to continuously flow, and the reaction furnace interior pressure was 80.7±1.2 mtorr.

After the reaction furnace interior temperature reached the depositing temperature, a required amount of silane, a raw material gas, or of a mixed gas of silane and a dilution gas was introduced into the reaction furnace to deposit a silicon thin film 104. As the dilution gas, the same combination of gases that was caused to flow during the temperature-raising period can be used, and what is preferred is that the respective gases have a 99.999% or higher purity. In Example 1, in place of a dilution gas, 100 SCCM of silane of a 99.999% or higher purity was caused to flow to deposit the silicon thin film 104. At this time, the reaction furnace interior pressure was kept at 398.6±1.9 mtorr by adjusting a conductance valve disposed between the reaction furnace and the mechanical booster pump. In Example 1, the silicon thin film 104 for the channel region was deposited at the deposition rate of 21.2 Å/min. in a 248 Å-film thickness.

In Example 1, the deposition of the silicon thin films were conducted by LPCVD using monosilane as the raw material gas. In place of LPCVD, plasma CVD, APCVD, sputtering, etc. can be used. The raw material gas is not limited to monosilane gas, and higher order silane, such as disilane, trisilane, or dichlorsilane, etc. can be also used. It is also possible to deposit the silicon thin films by the above-mentioned various CVDs using various combinations of the above-mentioned raw materials.

Subsequently the thus-prepared substrate was heat-treated to improve the crystallinity of the silicon thin film 104 and to increase the crystal grain. The heat-treating furnace was a vertical furnace and was kept usually at 400° C. 20 SLM of nitrogen gas of a 99.999% or higher purity was kept flowing to retain the interior of the heat treating furnace in the inert ambient atmosphere. The substrate which was in an equilibrium with the room temperature was inserted for 17 minutes in the vertical heat-treating furnace of 400° C. The interior of the heat-treating furnace was kept at 400° C. for 30 minutes after the insertion of the substrate, and after the interior temperature of the heat treating furnace reached 400° C. evenly all over the interior of the heat treating furnace independently of a position of the substrate, the interior temperature of the furnace was raised to 600° C. The substrate could have the same heat history anywhere irrespective of the position of the substrate in the heat treating furnace by keeping the furnace interior temperature first at 400° C. for 30 minutes. This made the crystallization of the silicon film homogeneous. 20 SLM of nitrogen was caused to always flow continuously in the heat treating furnace, and by the pre-heating at 400° C. the interior of the heat treating furnace whose volume was about 178 liter was replaced completely by nitrogen ambient atmosphere. The temperature increase from 400° C. to 600° C. was performed over about one hour, and after the temperature equilibrium was obtained at 600° C., the silicon thin film was crystallized by the heat treatment over more than 7 hours. In Example 1, the heat treatment was conducted for 23 hours after the temperature reached 600° C.

Figure 1C:

The thus-prepared silicon thin film was patterned using a resist, and then etched with mixed plasma of carbon tetrafluoride ($CF_4$) and oxygen ($O_2$), and a channel silicon thin film 105 was formed (FIG. 1C). In Example 1, an etching speed of this silicon thin film was 2.1 Å/sec under a 700 W-output, a 15 Pa-vacuum and plasma discharge of $CF_4$ and $O_2$ in the ratio of 50 SCCM : 100 SCCM.

Figure 1D:
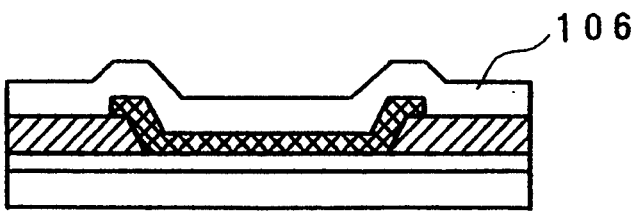
Figure 2:
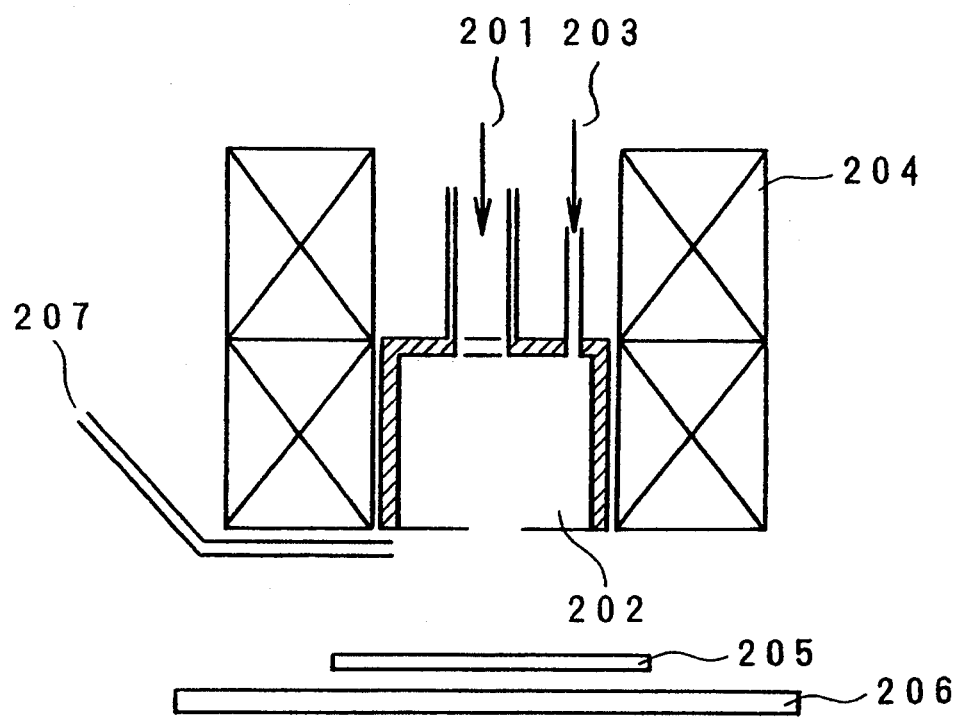
FIG. 2 is a schematic view of the electronic cyclotron resonance plasma CVD device used in the examples of this invention.

Next, this substrate was cleaned with boiling 60%-concentration nitric acid and then immersed in 1.67%-hydrofluoric acid aqueous solution for 20 seconds to remove the natural oxide films on the source and the drain regions 103, and the channel silicon thin film 105. Immediately after the clean silicon surface was exposed, a $SiO_2$ film 106 as a gate insulating film was deposited by electronic cyclotron resonance plasma CVD device (ECR-PECVD device) (FIG. 1D). FIG. 2 is a schematic view of the ECR-PECVD device used in Example 1. In depositing the gate insulating film, 2.45 GHz microwaves were guided into a reaction chamber 202 through a waveguide 201 to form 100 SCCm of oxygen fed through a gas-feed pipe 203 into a plasma. At this time, the output of the microwaves was 2250 W, and a 875 Gauss magnetic field was applied to the oxygen plasma in the reaction chamber 202 by an outside coil 204 disposed around the outside periphery of the reaction chamber 202 so that the electrons in the plasma satisfied the ECR condition. This oxygen plasma was drawn out of the chamber by the above-mentioned divergent magnetic field to radiate for 10 seconds the substrate 205 positioned perpendicular to the plasma. A heater 205 was deposed behind the substrate 208 to keep the entire substrate 205 at 100° C. At this time the reaction chamber interior pressure was 1.85 mtorr. Another gas-feed pipe 207 was disposed immediately behind the oxygen plasma drawing-out opening. After the oxygen plasma had become stable in 10 seconds, 60 SCCM of 99.999% or higher-purity silane was mixed in the oxygen plasma. The thus-prepared oxygen/silane plasma was radiated to the substrate for 30 seconds, and a $SiO_2$ film as the gate insulating layer was deposited in a 1500 Å thickness. (FIG. 1D). At this time, the reaction chamber interior pressure was 2.35 mtorr.

Figure 1E:
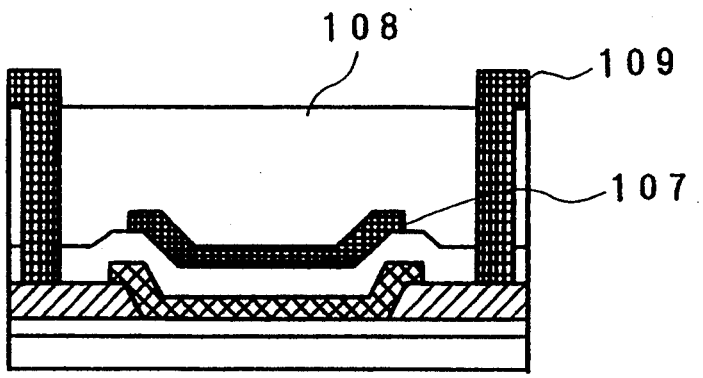

Next, chrome was deposited in 1500 Å by sputtering, and a gate electrode 107 was formed by patterning. The sheet resistance at this time was 1.356±0.047 Ω/square. In Example 1, chrome was used as a material of the gate electrode, but conductive materials other than chrome can be used, and the technique for forming the gate electrode is not limited to sputtering and may be formed by evaporation, CVD, etc. Next, a $SiO_2$ film for an inter-layer insulating film 108 was deposited in 5000 Å by APCVD. This deposition was performed on the same depositing conditions as the protective underlayer $SiO_2$ film only except the depositing time. Following the formation of the inter-layer insulating film, contact holes were opened, and a source and a drain electrodes 109 were formed by sputtering, and a transistor was completed (FIG. 1E). In Example 1, as the source and the drain electrodes, aluminum was deposited in 8000 Å by sputtering. The sheet resistance of the deposited aluminum film at this time was 42.48±2.02 mΩ/square.

Figure 3:
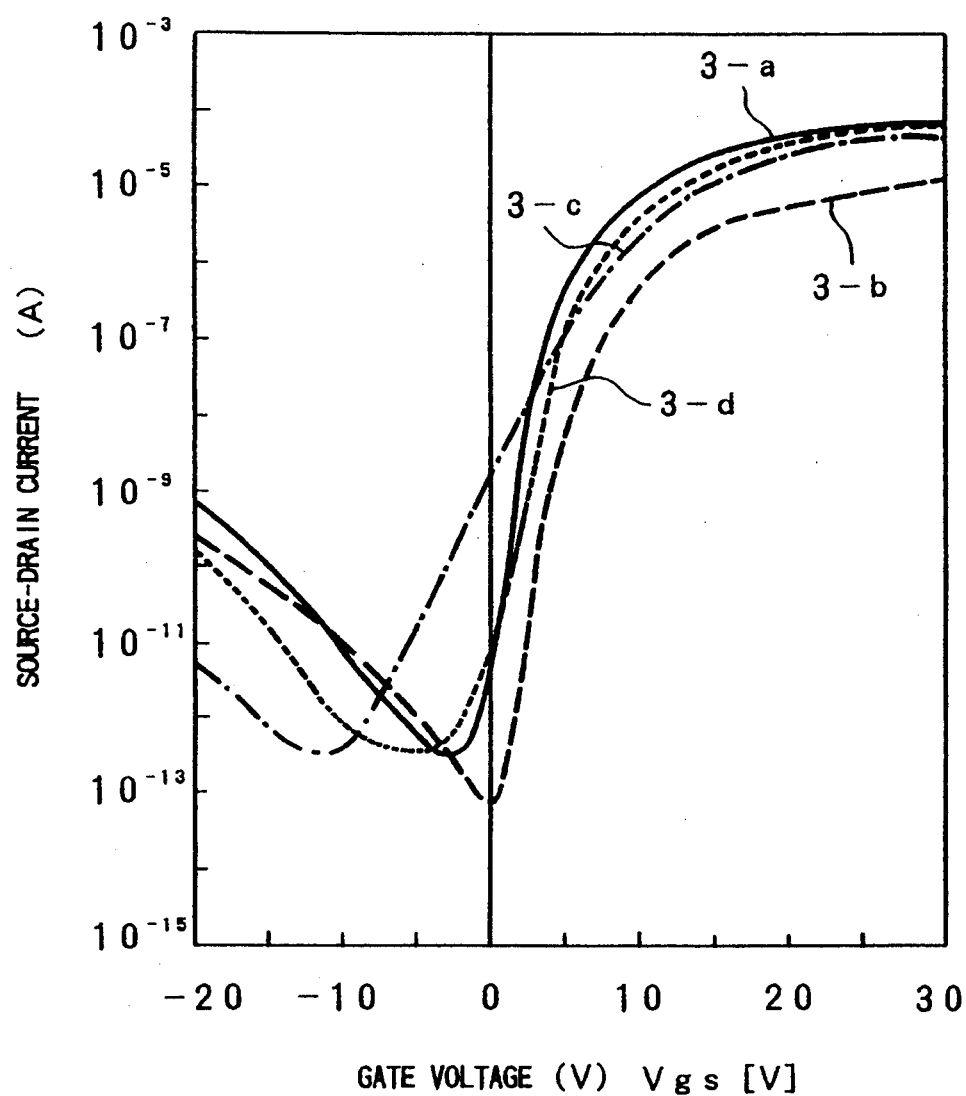
FIG. 3 is a view explaining an effect of this invention.

One example, Vgs-Ids curve, of a characteristic of the thus-fabricated thin film transistor is shown in FIG. 3 at 3-a. A source-drain current Ids was measured with a source-drain voltage Vds=4 V and at 25° C. The size of the transistor was a channel length of L=10 μm, and a width of W=10 μm. The ON-state current of the transistor was measured on five transistors at the center and four corners of the 235 mm-square substrate when Vds=4 V, and Vgs=10 V. I ON=4.65±0.39 μA. Thus a thin film semiconductor device having a good characteristic, I ON=4.65±0.39 μA, has been obtained. The electric field effect mobility μ0 and the trap density Nt (J. Levinson et al., J. Appl. Phys. 53, 1193, 1982) in the saturation current regions of the transistors were $\mu_0 = 25.85 \pm 0.96$ $cm^2/v \cdot sec$. and $Nt = (6.81 \pm 0.15) \times 10^{11}$ $1/cm^2$. A transistor characteristic of a thin film semiconductor transistor fabricated in accordance with one example of the prior art processes is shown in FIG. 3 at 3-b. This thin film semiconductor transistor was fabricated by the same process as that according to Example 1 of this invention except that the channel silicon thin film was deposited at 600° C. by low pressure CVD and was not subjected to the 24 hour-heat treatment. The reactor for depositing the channel silicon thin film by low pressure CVD was the same as that used in Example 1 of this invention. 12.5 SCCM of monosilane as the raw material gas was fed, the reaction furnace interior pressure was 9.0 mtorr, the depositing rate was 11.75 Å/min, and the film thickness was 256 Å. This TFT fabricated according to one example of the prior art processes had an ON-state current of Ids=0.91±0.12 μA, an electric field mobility of μo=4.75±0.20 cm$^2$, and a trap density of Nt=(5.18±0.13)×10$^{11}$ 1/cm$^2$. Another thin film semiconductor device was fabricated by the same process as that according to Example 1 of this invention except that the channel silicon thin film was deposited by low-pressure CVD at 600° C. using 12.5 SCCM of monosilane, and the gate insulating film was deposited by the same technique as in Example of this invention and was subjected to hydrogen plasma treatment by an ECR-PECVD device. This is one example of the prior art processes including the hydrogenation treatment. The hydrogenation treatment was conducted after the chamber of the ECR-PECVD device of FIG. 2 was evacuated following the formation of the gate insulating film by the ECR-PECVD device, and then the temperature of the substrate 205 was raised up to 300° C. in one hour by a heater 206. 125 SCCM of 99.9999% or high purity-hydrogen was fed into the reaction chamber 202 through a gas-feed pipe 203 to form a hydrogen plasma. The microwave output was 2000 W, and the reaction chamber interior pressure was 2.63 mtorr. The hydrogen plasma was radiated for 30 minutes. The TFT characteristic of the thus-fabricated thin film semiconductor device was measured. The ON-state current Ids=0.96±0.13 μA, the electric field effect mobility μo=4.68±0.22 cm$^2$/v·sec., and the trap density Nt=(5.12±0.13)×10$^{11}$ 1/cm$^2$. That is, compared with the prior art processes in which the channel silicon films were deposited at 600° C. by low-pressure CVD irrespective of the use of the hydrogen plasma treatment, this invention can drastically improve the transistor characteristic by enhancing, e.g., the electric field effect mobility about 5 times.

Next, this invention will be compared with further different examples of the prior art processes. That is, in the further different examples of the prior art processes, the channel silicon thin film was formed by the same technique as in Example 1 of this invention, but in one of the further different examples of the conventional processes the gate insulating film was deposited by APCVD, and in the other example, the gate insulating film was deposited by APCVD and then was subject to the hydrogen plasma treatment. It will be found this invention is far superior to the prior art processes. The process according to one of the further different examples in which a thin film semiconductor device was fabricated by depositing the gate insulating film by APCVD is the same as the process according to Example 1 of this invention except that the gate insulating film was deposited by APCVD in 1500 Å. In the APCVD, with the substrate temperature kept at 300° C., and with 300 SCCM of a mixed gas of 20% silane content nitrogen and silane, 420 SCCM of oxygen, and about 140 SLM of a dilution nitrogen fed, a SiO$_2$ film was deposited. The depositing speed was 1.85 Å/sec. FIG. 3 shows at 3-c the transistor characteristic of the thus-fabricated thin film semiconductor device. The ON-state current of this transistor was I ON=1.49 ±0.05 μA, the electric field effect mobility μo=24.60±0.72 cm$^2$/v·sec., and the trap density was Nt=(9.20±0.15)×10$^{11}$ 1/cm$^2$. In comparison of this invention with this prior art, it is evidently seen that this invention can fabricate a very good thin film semiconductor device which has a drastically reduced trap potential, and has a sharp rise around a gate voltage OV. In the prior art in which the gate insulating film was deposited by APCVD, the electric field mobility has been raised as high as in this invention, but the minimum value of the source-drain current is around −11 V and the trap density is high, and thus the rise inclination is blunt. This resultant thin film semiconductor is not practical. Furthermore, FIG. 3 shows at 3-d a further another example of the prior art. In this example, the channel silicon thin film was deposited in the same process as in Example 1 of this invention, but the gate insulating film was deposited by APCVD and then was subjected to hydrogen plasma. The gate insulating film was deposited under the same conditions as described above and then was immediately subjected to hydrogen plasma radiation under the same conditions as described above. In the other respects a thin film semiconductor device was fabricated in the same process as in Example 1 of this invention. The transistor characteristic of the thus-fabricated thin film semiconductor device is shown at 3-d in FIG. 3. Its ON-sate current was Ids=2.91±0.30 μA, the electric field effect mobility was μo=24.51±0.67 cm$^2$/v·sec., and the trap density was Nt=(7.94±0.15)×10$^{11}$ 1/cm$^2$. It is seen that, in comparison with the prior art using the hydrogen plasma treatment, this invention exhibits better characteristics in all the parameters. In the transistors fabricated by the prior art using the hydrogen plasma, one of the five measured transistors has a threshold voltage deviation Vth by about +2 V. The values of this transistor are not included in the averages value of the above-mentioned parameters and the standard deviation value thereof. That is, the prior art including the hydrogen plasma treatment improve transistor characteristics in comparison with the prior art including no hydrogen plasma treatment but find it difficult to fabricate transistors of the same quality homogeneously on a large area. In addition, lot to lot deviation is rather large, when the hydrogen treatment has been applied for fabricating the thin film transistors, which prevents the stable mass-production of the devices. Especially, the threshold voltage Vths and the gate voltages at which the source and drain current becomes the minimum vary to mach among lots. In contrast to this, it is found that this invention can omit the hydrogen plasma treatment, which results in the deviation, and still can fabricate transistors of superior quality homogeneously on a large area and stably among lots.

EXAMPLE 2

Figure 4:
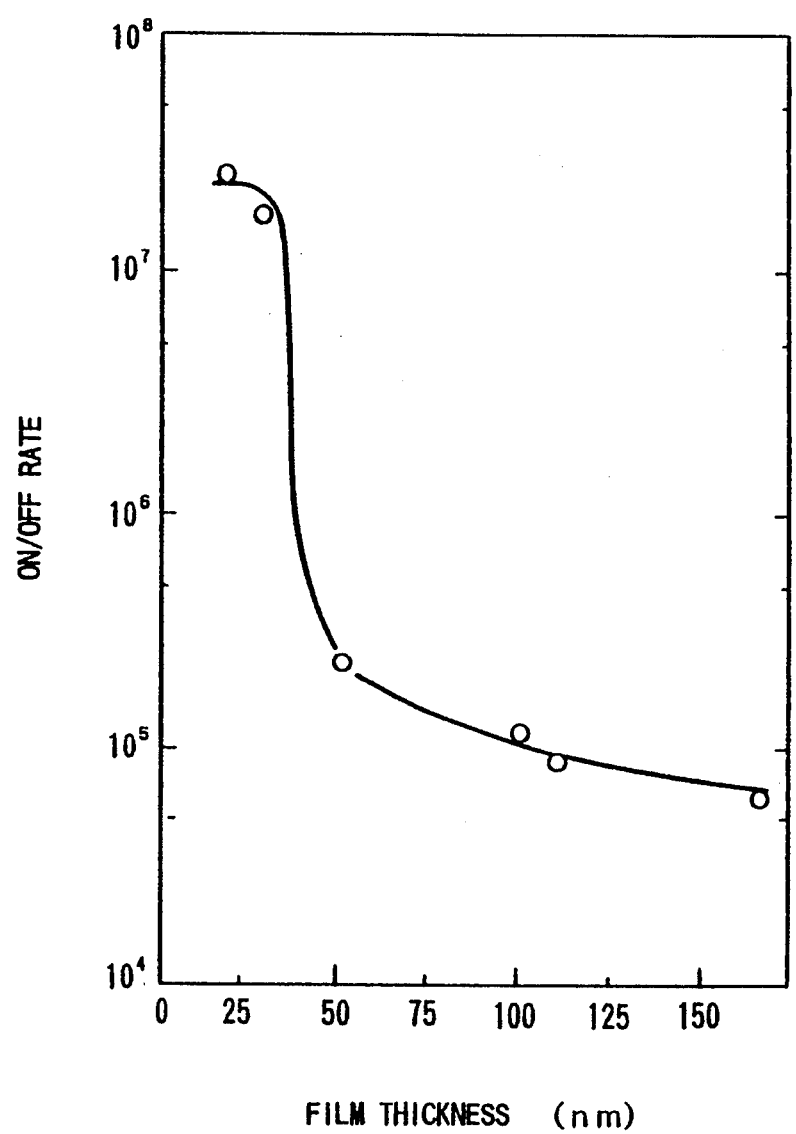
FIG. 4 is a view explaining an effect of this invention.

In this Example 2, a thin film semiconductor device was fabricated by the same process as in Example 1 except that the depositing time for the silicon thin film for the channel region (104 in FIG. 1) was changed to change the deposited film thickness of the silicon thin film 104. In this Example 2, the silicon thin film 104 was deposited in six different thicknesses of 190 Å, 280 Å, 515 Å, 1000 Å, 1100 Å and 1645 Å, and thin film semiconductor devices having these different silicon thin films 104 were fabricated. FIG. 4 shows the ratios of the ON-state currents of these thin film semiconductor devices to the OFF-state currents thereof with respect to film thickness of the channel silicon film. As seen from FIG. 4, the ratio of the ON-state current vs. OFF-state current is sharply improved to 7-or more-place-order when the thickness of the channel silicon film semiconductor layer is equal to or smaller than 500 Å, and the thin film semiconductor devices had such good characteristic.

EXAMPLE 3

Figure 5A:
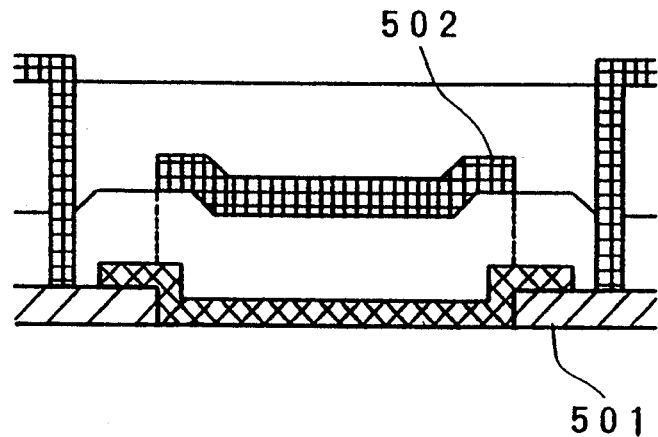
FIGS. 5A to 5C show sectional views of the silicon thin film semiconductor device according to an example of this invention in the respective fabrication steps.

In Example 3 a thin film semiconductor device (offset thin film semiconductor device) of the structure in which at least one of the source region and the drain region is not superposed on the gate electrode through the gate insulating film was fabricated by the same process as in Example 1. In Example 3, the staggered thin film semiconductor device shown in FIG. 5A was fabricated as an offset type thin film semiconductor device by alignment of high precision. It is possible to fabricate offset-type thin film semiconductor devices of structures other than the above. For example, it is possible to fabricate the structure shown in FIG. 5B in which a source and a drain regions 503 are formed by implanting dopant ions in an intrinsic silicon thin film with a gate electrode 504 as the mask, and also a reversely staggered thin film semiconductor device shown in FIG. 5C having a source and a drain regions 507 formed using a mask material 508.

Figure 6:
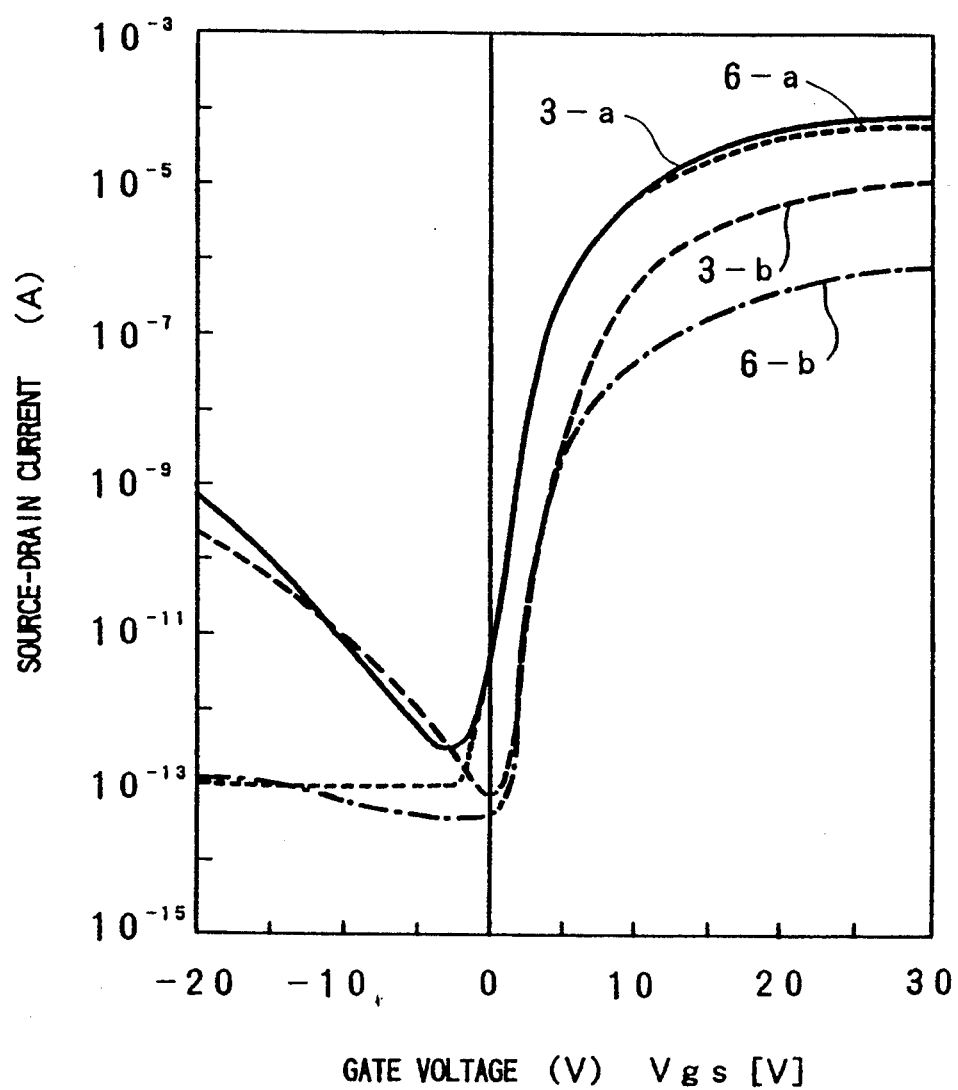

In Example 3, the offset-type thin film semiconductor device was fabricated by the same process as in Example 1 except the substrate was provided by a 75 mm-diameter fused quartz glass. That is, the substrate was cleaned, and a underlayer $SiO_2$ film was deposited by APCVD or other process, and then a phosphorus-added silicon film was deposited by LPCVD and patterned to form a source and a drain regions 501. The distance between the source and the drain regions, which was to be the channel length L, was 10.5 μm. Then in the same way as in Example 1, a silicon thin film for the channel region was deposited in 248 Å at a 21.2 Å/min. depositing speed. But in Example 1, the substrate was placed in the reaction furnace with the top surface thereof faced downward, but in Example 3, a 75 mm-substrate was placed in the reaction furnace, mounted on a 235 mm-square dummy quartz substrate with the top surface faced upward. Next by the same process as in example 1, the heat-treatment was conducted to deposit a gate insulating film, and a gate electrode 502 was formed. This gate electrode has a 10.0 μm-width, and high precision-alignment was performed so as to agree the midpoint of the source/drain distance with that of the gate electrode width 10.0 μm. Resultantly the distance between the gate electrode edge position, and the source region edge position and the drain region edge position (offset distance) were 0.25 μm respectively. Subsequently an inter-layer insulating film was formed by the same technique as in Example 1. Then following the opening of contact holes, wiring was formed of aluminum, and a thin film semiconductor device was completed. One example of the transistor property of the thus-fabricated thin film semiconductor devices Vgs-Ids curve is shown in FIG. 6 at 6-a. FIG. 3-a in FIG. 6 shows the transistor characteristic of the non-self-aligned staggered thin film semiconductor device according to Example 1. As evidently seen from FIG. 6, this invention according to Example 3 can much decrease a leak current occurring at a negative gate voltage. In Example 3, at a gate voltage below −2.5 V the sour-drain current is actually suppressed to about 0.1 pA. The transistor characteristic of the offset type-thin film semiconductor device fabricated by the prior art in Example is shown at 6-b as a control. That is, this transistor characteristic is obtained by the offset-type thin film semiconductor device fabricated by depositing the channel silicon thin film at 600° C. by low pressure CVD and aligning with high precision the midpoint of the source-drain distance of 10.5 μm with that of the gate electrode width of 10.0 μm. Accordingly the characteristic 6-b can be directly compared with that 3-b in FIG. 6 of the non-self-aligned staggered thin film semiconductor device fabricated by the prior art. It is possible to keep the leak current as low as about 0.1 pA, but impractically the offset type thin film semiconductor device fabricated by the prior art adversely has the transistor characteristics such as ON-state current, mobility, etc. deteriorated. For example, the ON-state current of the offset type thin film semiconductor device fabricated by the prior art adversely has a Ids $=0.090\pm0.01$ μA which is lower by one or more places than that of the non-self-aligned thin film semiconductor device. Its mobility as well is $\mu o = 3.33\pm0.15$ cm$^2$/v·sec. which is lowered by about 30%. For these reasons, it has been useless to fabricate offset type thin film semiconductor devices by the prior art. In contrast to this, as shown in FIG. 6 at 6-a, this invention according to Example 3 can suppress the leak current low and maintain the ON-state current high. Example 3 can obtain an ON-state current of Ids $=3.71\pm0.43$ μA, which is not inferior to the ON-state current of self-non-aligned thin film semiconductor device. This invention according to Example 3 exhibited a mobility as high as $\mu o = 22.00\pm0.95$ cm$^2$/v·sec.

EXAMPLE 4

Figure 5B:
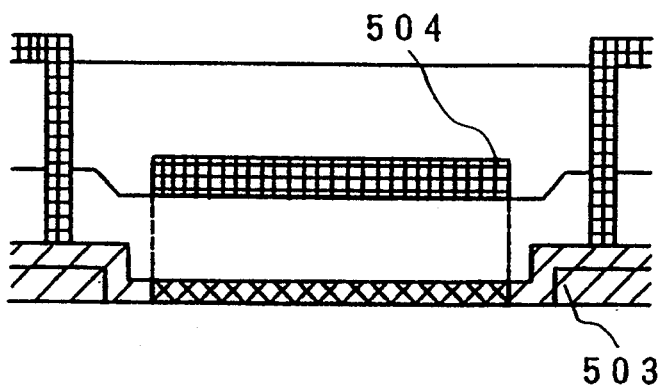
Figure 5C:
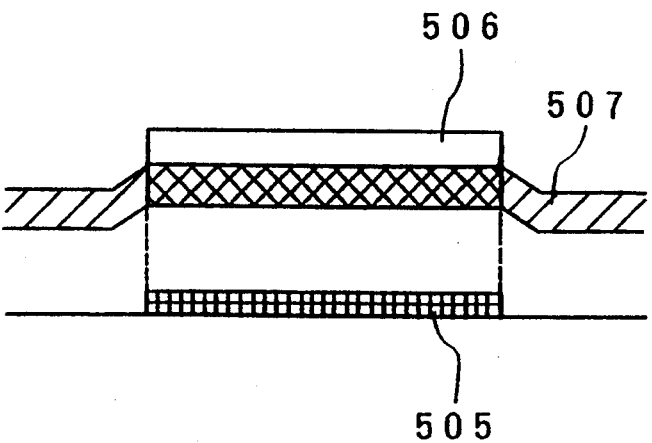

In Example 3 an offset type thin film semiconductor device was fabricated by high precision alignment, but, needless to say, this invention is effective to fabricate other types of thin film semiconductor devices. FIG. 5B shows an offset-type thin film semiconductor device fabricated by depositing an intrinsic silicon film, patterning a gate electrode, and then adding dopant ions. This process will be explained.

FIGS. 7A to 7D are sectional views explaining the process according to Example 4 for fabricating a silicon thin film semiconductor device constituting an offset type staggered MIS electric field-effect transistor. First, as in Example 1, a substrate 701 was cleaned, and then a $SiO_2$ film was deposited as a protective underlayer film 702 in a 2000 Å thickness. Next was formed a first silicon film 703 which was to be patterned into a pad. In Example 4, the first silicon film was deposited in a 1250 Å-thickness at a 12.5 SCCM silane flow rate, at a 600° C. depositing temperature by LPCVD, which was used also in Example 1 in deposing the channel silicon film. But it is possible to deposit the silicon film at a 550° C. depositing temperature also by LPCVD, to deposit the silicon film using disilane ($Si_2H_6$) as the raw material gas at a 450° C. depositing temperature, or to deposit the silicon film at a 250° C. depositing temperature by PECVD. Any technique may be used unless the film forming temperature exceeds the maximum processing temperature of 600° C. Subsequently a second silicon film 704 was deposited. If the second silicon film 704 has a thickness equal to or larger than 300 Å, and the resistance values of the impurities-added source and drain regions are sufficiently lower than the resistance value of the channel region when the transistor is in operation, the first silicon film or the silicon film 703 to be patterned into a pad are not necessary.

Figure 7A:
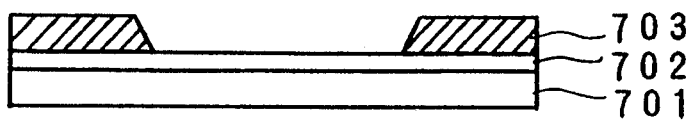
FIGS. 7A to 7D show sectional views of the silicon thin film semiconductor device according to an example of this invention in the respective fabrication steps.
Figure 7B:
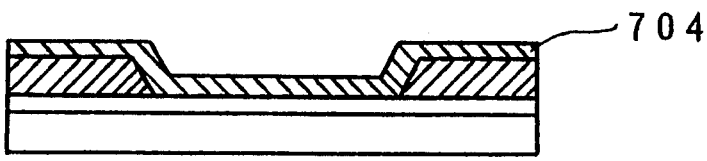
Figure 7C:
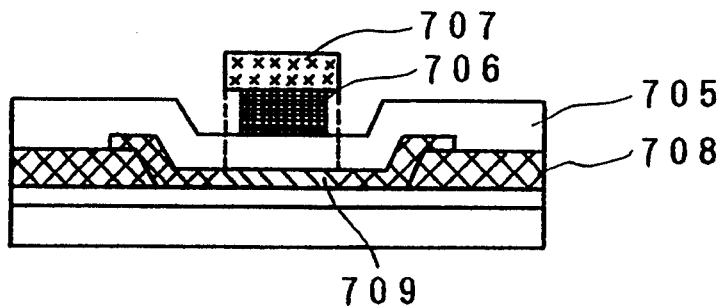
Figure 7D:
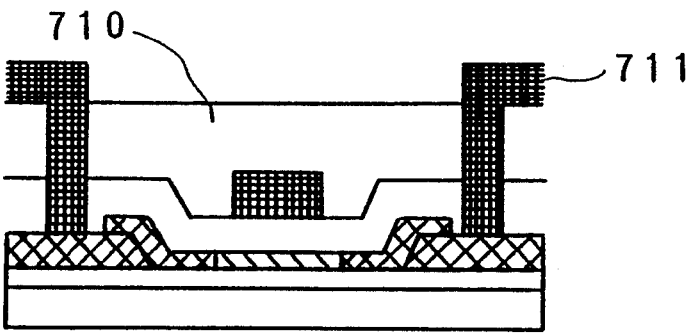

In Example 4, the second silicon film 704 was deposited by the same technique as that for forming the silicon film for the channel region in Example 1. That is, the second silicon film 704 was deposited, using 100 SCCM of silane at 550° C., in a 250 Å thickness, at a 21.2 Å/min. depositing speed by LPCVD. Any technique may be used in forming the second silicon film as in forming the first silicon film unless the film forming temperature exceeds the maximum processing temperature of 600° C. For example, the second silicon film as well may be deposited using 12.5 SCCM of silane at a 600° C. depositing temperature, and at a 9.0 mtorr reaction furnace interior pressure. It is also possible to form the second silicon film using, as the raw material gas, a higher silane, such as disilane, trisilane or others, at a lower temperature. Thus the second silicon film 704 was formed by any one of these techniques (FIG. 7B) and patterned. Then as in Example 1, a gate insulating layer 705 was formed. That is, a $SiO_2$ was deposited in a 1500 Å-thickness by ECR-PECVD. The gate insulating layer 705 may be formed by APCVD in the case that the second silicon film 704 is a polycrystalline silicon film. Subsequently a metal film for a gate electrode was formed. In Example 4, as the material of the gate electrode, a silicon film having a high concentration of phosphorus added was used. This silicon film was deposited in a 3000 Å-thickness, using 200 SCCM of silane, 6 SCCM of the mixed gas of 99.5% of helium and 0.5% of phosphine and 100 SCCM of helium by LPCVD at a 600° C. depositing temperature and at a 100 mtorr reaction furnace interior pressure. The sheet resistance of the silicon film immediately after formed was 744 Ω/square. Subsequently a resist was applied and patterned. Then the phosphorus-added silicon film was patterned by a mixed plasma of $CF_4$ and $O_2$. The ratio of $CF_4$ and $O_2$ was 200 SCCM vs. 200 SCCM, and the power of the incident wave for the patterning was 700 W. At this time, the phosphorus-added silicon film was etched with the etching rate of 15.4 Å/sec. for 5 minutes and 57 seconds to form a gate electrode 708. Since the thickness of the phosphorus-added silicon film was 3000 Å, this plasma etching reduced the width of the gate electrode on the right and the left sides about 2500 Å, respectively, with respect to the resist 707 (FIG. 7C). Then dopant ions were added with the resist 707 used in forming the gate electrode 708 left unremoved. As the dopant ions, in Example 4 phosphorus was selected for the purpose of fabricating an n-thin film semiconductor device, but other different ions may be used in accordance with purposes. In Example 4 the ions were implanted by an ion implanting system without a mass spectrometric analyzer. The raw material gas was a 5% -concentration phosphine diluted in hydrogen. The phosphine was implanted at a 110 kV acceleration voltage in a $3 \times 10^{15}$ 1/cm². Thus the first and the second silicon films were partially formed into the source and the drain region 708. The resist 707 used in forming the gate electrode had such a thickness of about 2 μm that the ions were not added to the second silicon film, and a channel region 709 was formed (FIG. 7C). This process can also fabricate an offset type thin film semiconductor device. Then the resist 707 used in the formation of the gate electrode was removed, and then the substrate was heat-treated at 800° C. for more than 7 hours for the activation of the added dopant ions, and the improvement of the crystallinity of the channel silicon film 709 if its crystallinity was insufficient. In Example 4, the heat-treatment was conducted, as in Example 1, at 600° C. for 23 hours in a nitrogen ambient atmosphere. Subsequently a $SiO_2$ 710 as an inter-layer insulating film was deposited in 5000 Å by APCVD or others. Then hydrogen was implanted at an 80 kV acceleration voltage in $5 \times 10^{15}$ 1/cm² by an implanting system without a mass spectrometric analyzer. Next, contact holes were opened, and a wiring 711 was formed by aluminum, and offset-type thin film semiconductor device was completed.

The transistor characteristic of the thus-fabricated offset-type thin film semiconductor was measured. When $L=W=10$ μm, the ON-state current was 3.4 μA. The minimum value of the source-drain current was 0.09 pA when $Vgs = -3.5$ V. The OFF-state current was 0.28 pA when $Vgs = -10$ V, and the leak current when the transistor is off was suppressed low, but good ON-current could be obtained.

As described in Examples 3 and 4, it is possible to fabricate offset-type thin film semiconductor devices having high ON-state currents and small leak currents by heat-treating the devices following the formation of their source and drain regions. But this invention is never limited to the processes according to Examples 3 and 4 for fabricating offset-type semiconductor devices. For example, in the process for fabricating an offset-type thin film semiconductor device according to Example 4, a resist whose width is larger than the gate electrode width was used as the mask for the implantation, but other different techniques can be used. To given an instance, a metal is used as the gate electrode, and the surface and the insides of the metal are oxidized to thin the gate electrode, and then dopant ions are added, whereby an offset-type thin film semiconductor device can be fabricated. The reversely staggered structure of FIG. 5C can be fabricated into an offset-type thin film semiconductor device by increasing the width of the mask 508 than the width of the gate electrode 505. Thus this invention enables any process for fabricating thin film semiconductor devices to provide offset-type thin film semiconductor devices.

EXAMPLE 5

FIGS. 8A to 8F show sectional views of the steps for fabricating a silicon thin film semiconductor device constituting a MIS field-effect transistor.

Figure 8A:
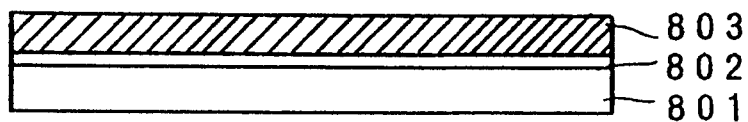
FIGS. 8A to 8F show sectional views of the silicon thin film semiconductor device according to an example of this invention in the respective fabrication steps.
Figure 8B:
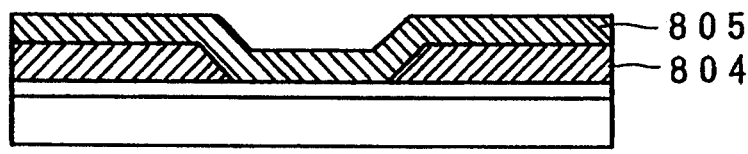

In Example 5 a 235 mm square-quartz glass was used as an insulative substrate 801. The kind and the size of the substrate 801 can be any as long as the substrate 801 is a substrate or a substrate material which can withstand 600° C. For example, a three-dimensional LSI formed on a silicon wafer can be used as the substrate. A underlayer $SiO_2$ film 802 was deposited by atmospheric pressure chemical vapor deposition (APCVD) on the top surface of the quartz glass 801 which has been subjected to organic cleaning and acid cleaning. This $SiO_2$ film was deposited using 120 SCCM of silane, 840 SCCM of oxygen and 140 SLM of nitrogen at a 300° C. substrate temperature. The depositing speed was 3.9 Å/sec. and the depositing time was 8 minutes 33 seconds. Then a silicon thin film 803 having a dopant as donors or acceptors added was deposited by low pressure chemical vapor deposition (LPCVD) (FIG. 8A). In Example 5 this silicon thin film 803 was deposited in a 1500 Å-thickness, using phosphorus as the dopant, and 0.03 SCCM of phosphine ($PH_3$) and 200 SCCM of silane ($SiH_4$) as the raw material gas at a 600° C. depositing temperature. The depositing speed was 30 Å/min., and the sheet resistance immediately after the deposition was 1951 Ω/square. Then a resist was formed on the silicon thin film 803, and the silicon thin film 803 was patterned by a mixed plasma of carbon tetrafluoride ($CF_4$), oxygen ($O_2$), nitrogen ($N_2$), etc., and a source and a drain region 804 were formed. Then soil and natural oxide films on the surfaces of the regions 804 were removed, and then immediately an amorphous silicon thin film 805 was deposited by LPCVD (FIG. 8B). In Example 5, in the low pressure CVD device, its reaction chamber was made of quartz glass with its volume of 184.5 l. Around the outside of the reaction chamber there was disposed a heater having three separate zones. The three zones were adjusted so that a required iso thermal zone could be formed near the center of the reaction chamber. The substrate was placed horizontally in the territory of the iso thermal zone to deposit the amorphous silicon thin film 805. For the deposition of the amorphous silicon thin film 805, 100 SCCM of disilane ($Si_2H_6$) as the raw material gas, and 100 SCCM of helium as the dilution gas were used. The depositing temperature was 450° C. In Example 5, the exhaustion of the low pressure CVD furnace used in the formation of the amorphous silicon thin film 805 was conducted a mechanical booster pump and a rotary pump directly connected to the former. There was provided a conductance valve between the mechanical booster pump and the reaction furnace. This conductance valve was suitably opened and closed so that the reaction chamber interior pressure could be adjusted and maintained as required. In Example 5 the reaction chamber interior pressure was retained at 306 mtorr during the deposition of the amorphous silicon thin film 805. The amorphous silicon thin film 805 was deposited in a 307 Å-thickness at a 18.07 Å/min. depositing speed. A resist was formed on the thus-deposited amorphous silicon thin film 805. Then the resist was patterned by a mixed plasma of carbon tetrafluoride ($CF_4$), oxygen ($O_2$), nitrogen (N), etc.. That of the amorphous silicon thin film 805 at the position where a channel region was to be formed was left unremoved.

Figure 8C:
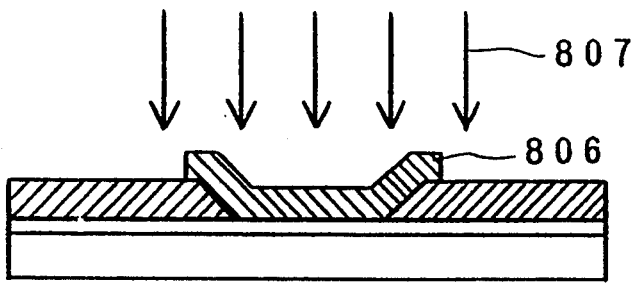
Figure 8D:
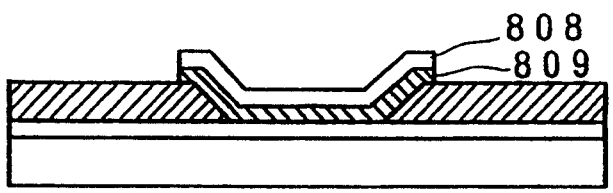
Figure 8E:
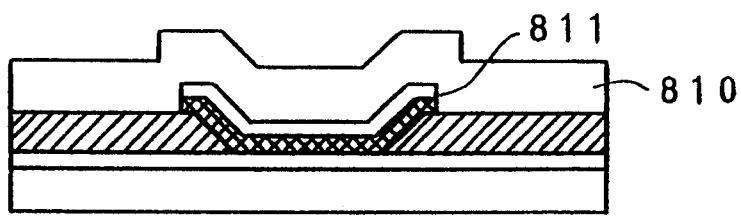

Subsequently this substrate was cleaned with boiling 60%-concentration nitric acid. Then the substrate was immersed in 20 seconds in 1.67% hydrofluoric acid aqueous solution to remove the remaining natural oxide films at the positions where a source and a drain regions 804, and a channel region were to be formed. When the clean silicon film was exposed, immediately an oxygen plasma 807 was radiated to the exposed silicon film by a electronic cyclotron resonance plasma CVD device (ECR-PECVD device) (FIG. 8C). The ECR-PECVD device used in Example 5, is schematically shown in FIG. 2. The oxygen plasma was formed by guiding 2.45 GHz microwaves to a reaction chamber 202 through a waveguide 201 and feeding 100 SCCM of oxygen from the gas-feed pipe 203. The reaction chamber interior pressure was 1.84 mtorr, and the output of the microwaves was 2500 W. An outside coil 204 was provided around the outside of the reaction chamber for applying a magnetic field of 875 Gauss to the oxygen plasma so that the electrons in the plasma satisfied the ECR condition. The substrate 205 was placed perpendicular to the plasma, and the substrate temperature was kept 300° C. by the heater. On these conditions the oxygen plasma 807 was radiated for 8 minutes 20 seconds to oxidize that of the amorphous silicon thin film 808 left at the position for the channel region to be formed in, and a $SiO_2$ film 808 which was to be a part of a gate insulating film was formed. Below the part which was to be a part of the gate insulating layer that of the amorphous silicon thin film 809 which was to be the channel region was left. (FIG. 8E).

Successively, with the vacuum maintained, a $SiO_2$ film 810 which was to be the gate insulating layer was deposited. This $SiO_2$ film 810 was deposited using 60 SCCM of silane and 100 SCCM of oxygen at a 2250 microwave output, a 300° C. substrate temperature and for 18.7 seconds. The reaction chamber pressure was 2.62 mtorr. The thus-formed multi-layer films were measured by a multi-wavelength dispersive ellipsometry (multi-wavelength spectroellipsometry, MOSS-ES 4G, by SOPRA). The remaining amorphous silicon film 809 which was to be formed in the channel portion had 205 Å. The $SiO_2$ film formed by the oxidation of the amorphous silicon film 808 had 120 Å. The $SiO_2$ film 810 had 1500 Å. At the wavelength of 632.8 nm the refractive indices of the $SiO_2$ film 808 and the $SiO_2$ film 810 were 1.42 and 1.40 respectively.

Figure 8F:
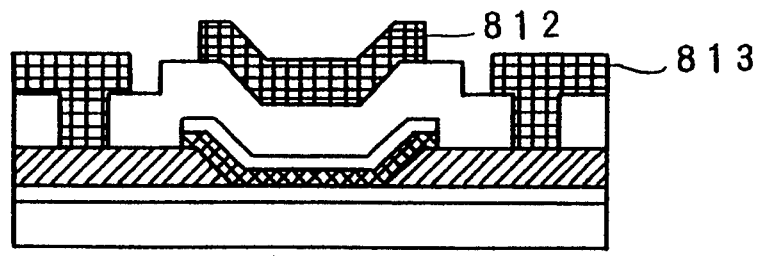

Then the thus-prepared substrate was inserted in a 600° C.-electric furnace and was heat-treated for 48 hours. At this time, the electric furnace was kept supplied with 99.999% or higher purity nitrogen gas at 20 l/min. to maintain an inert ambient atmosphere. This heat-treatment at 600° C. in the inert ambient atmosphere crystallized the amorphous silicon left on the part which was to be the channel region to be transformed into a silicon thin film 811 constituting the channel region (FIG. BE). Subsequently this substrate was placed again into the ECR-PECVD to radiate a hydrogen plasma to the heat-treated substrate. The hydrogen plasma was formed using 100 SCCM of hydrogen at a 300° C. substrate temperature and a 2000 W microwave output. In this state, the reaction chamber interior pressure was 1.97 mtorr, and the hydrogen plasma radiation was conducted for 45 minutes. Then chrome was deposited in 1500 Å by sputtering. A gate electrode 812 was formed by patterning. At this time the sheet resistance was 1.36 Ω/square. A contact hole was formed in the gate insulating film, and a source and a drain electrodes 813 were formed by sputtering or other techniques, and a transistor was completed by patterning (FIG. 8F). In Example 5, as the material of the source and the drain electrodes aluminum of a 8000 Å-thickness was used. The sheet resistance of this aluminum was 42 mΩ/square.

Figure 9:
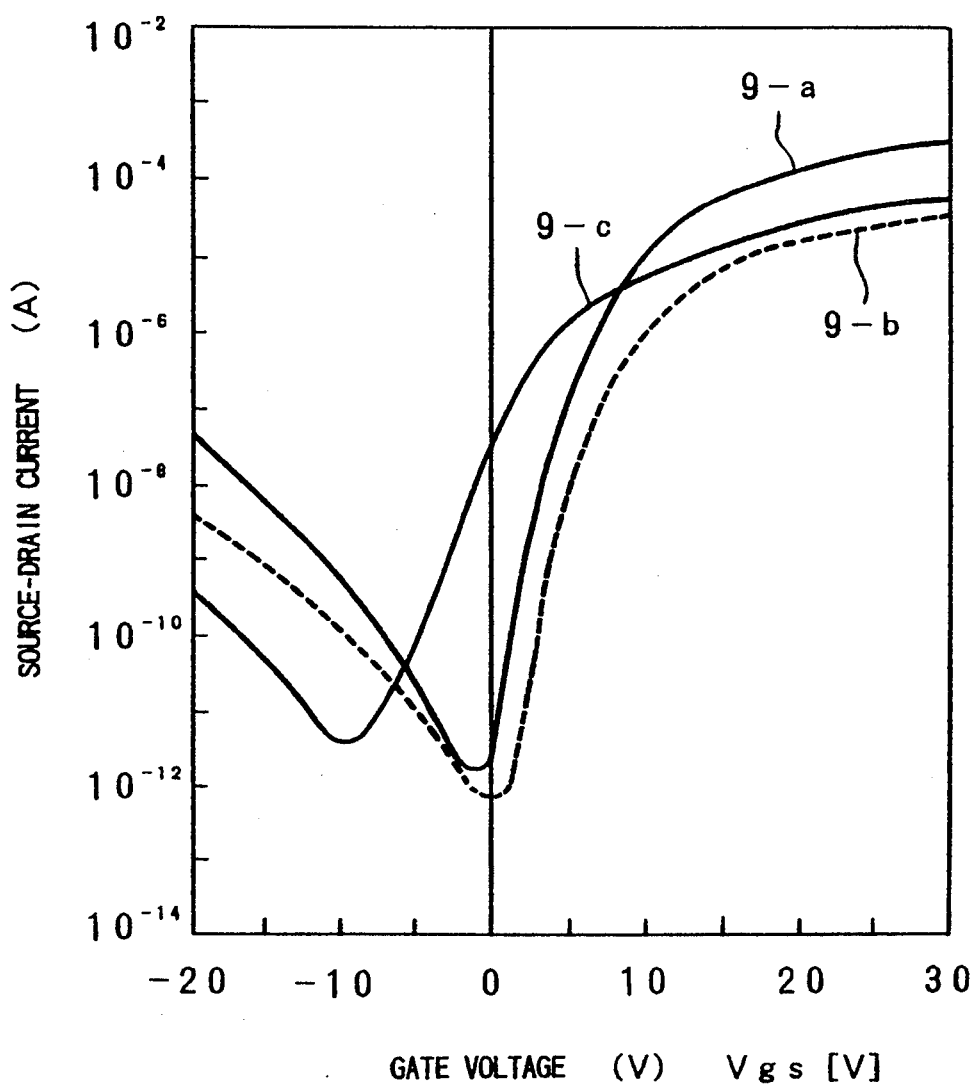
FIG. 9 is a view explaining an effect of this invention.

One example of characteristics of the thus-fabricated thin film transistor (TFT) is shown in FIG. 9 at 9-a. Here Ids denotes a source-drain voltage. The measurement was conducted at Vds=4 V and at 25° C. The transistor had a channel length of L =10 μm and a width of W=100 μm. When the transistor was turned on at Vds=4 V and Vgs=10 V, its ON-state current was Ids=34.5 μA. The resultant thin film semiconductor device had such good transistor characteristic. The field effect mobility of this transistor based on the saturation current region was 12.52 cm²/v·sec. The transistor characteristic of a thin film semiconductor device fabricated by the prior art is shown as a control at 9-b. This thin film semiconductor device fabricated by the prior art was fabricated by the same process as Example 5 except that the channel silicon thin film of the former was deposited at 600° C. by low pressure CVD, and the oxygen plasma was not radiated. The reactor for depositing the channel silicon thin film by low pressure CVD was the same as that used in Example 5 in depositing the amorphous silicon thin film. The channel silicon thin film was deposited in 252 Å-thickness using 24 SCCM of monosilane as the raw material gas at a reaction furnace interior pressure of 13.8 mtorr and a 19.00 Å/min. depositing speed. The ON-state current of the TFT fabricated by the prior art was Ids=4.6 μA, and the field effect mobility there was 4.40 cm²/v·sec. As another control, a thin film semiconductor device was fabricated by the same process as Example 5 except that the channel silicon thin film which was deposited at 600° C. by low pressure CVD as done in the above-described prior art was subjected to oxygen plasma radiation before the deposition of the gate insulating film. The TFT characteristic of this thin film semiconductor device was measured. The TFT characteristic did not substantially change due to the oxygen plasma radiation, and the Vgs-Ids curve of this TFT, which was subjected to the oxygen plasma radiation agreed with that of 9-b. The ON-state current of this TFT was Ids=4.7 μA, and its field effect mobility was 4.44 cm²/v·sec. The oxygen plasma radiation is not much effective in the prior art in which the channel silicon thin film is deposited at 600° C. by low pressure CVD. The TFT characteristic of a thin film semiconductor device fabricated by further another prior art is shown at 9-c. This thin film semiconductor device was fabricated by the same process as Example 5 except that the oxygen plasma radiation was not conducted. That is, an amorphous silicon thin film was deposited as the channel silicon layer and then was subjected to heat-treatment at 600° C. But the oxygen plasma radiation was not conducted before the formation of the gate insulating layer. The TFT fabricated by this prior art had a depletion of −10 V and had a poor rise characteristic. The ON-state current of this thin film semiconductor device was 12.1 μA at Vds=4 V and Vgs=10 V. The field effect mobility was 9.94 cm²/v·sec.

It is seen from these results that the transistor characteristic of the thin film semiconductor device is drastically improved only when the amorphous silicon thin film which is to be the channel region is radiated with an oxygen plasma and then heat-treated to crystallize the channel silicon thin film. This is because the oxidation of the surface of the amorphous silicon film by the oxygen plasma produces clean MIS interfaces, and the crystallization is performed. Thus it is seen that the examples of this invention have much better semiconductor characteristics than those fabricated by the prior art.

EXAMPLE 6

A silicon film and a silicon oxide film were formed on an insulative material, and then dopants as donors or acceptors was added to the silicon film, and a conducting layer of the silicon film was formed. In Example 6, a substrate was provided by a 75 mm-diameter fused quartz substrate. The substrate may be any material as long as it can withstand the heat-treatment at about 600° C. For example, processed silicon substrates may be used. A underlayer $SiO_2$ film was deposited by APCVD on the substrate which had been organic- and acid-cleaned. This $SiO_2$ film was formed using 120 SCCM of silane, 840 SCCM of oxygen and about 140 SLM of nitrogen at a 300° C. substrate temperature. The depositing speed was 3.9 Å/sec., and the depositing time was 12 minutes and 49 seconds. Subsequently a silicon film was deposited by the LPCVD device used in the deposition of the channel silicon film in Example 1. The silicon film was deposited at the temperature of 550° C. using 100 SCCM of silane at a 400 mtorr reaction chamber interior pressure for 11 minutes and 20 seconds. The silicon film thickness was 252 Å.

The thus-prepared substrate was heat-treated to improve the crystallinity. This heat-treatment technique was the same as that used in the crystallinity improvement of the silicon film 104. That is, the heat-treatment was conducted at 600° C. for 23 hours in a nitrogen ambient atmosphere. Following this heat-treatment the silicon film was patterned with a resist, and further was etched with a mixed plasma of $CF_4$ and $O_2$, and a wiring pattern of the silicon film was formed.

Subsequently this substrate was cleaned with boiling 60% concentration-nitric acid, and further was immersed in 1.67% hydrofluoric acid aqueous solution for 20 seconds to remove the natural oxide film, and the clean silicon surface was exposed. Immediately a silicon oxide film was deposited thereon in a 1500 Å-thickness by ECR-PECVD. This silicon oxide film was deposited by the same technique as used in Example 1 for the formation of the gate insulating film. Then dopant ions as donors or acceptors were added to the wiring of the silicon film by an ion implanting system. In Example 6 phosphorus was selected as the dopant for the purpose of fabricating an n-conducting layer. But other different elements may be used in accordance with purposes. In Example 6 dopant ions were added by a bucket ion implanting system of non mass separating type. The raw material gas was 5%-concentration phosphine diluted with hydrogen. The dopant ions were implanted through the silicon oxide film at a 110 KV acceleration voltage in a $3 \times 10^{15}$ 1/cm². Then this substrate was placed in a furnace kept at 300° C. in a nitrogen ambient atmosphere for heat-treatment. The heat-treating time was exactly 1 hour. After the heat-treatment at 300° C., contact holes were opened in the silicon oxide film, and electrodes were formed of aluminum. The resistance of the thus-formed dopant-added silicon oxide film wiring was measured. The sheet resistance was $(71 \pm 15)$ kΩ/square with 95% confidential level was measured. It has been believed generally impossible to add dopant ions to a hundreds Å-thickness thin film, and to activate the added ions at a temperature as low as about 300° C. so as to obtain a conducting layer. That is, in this invention the film quality of the heat-treated silicon film which was coated with the silicon oxide film deposited by ECR-PECVD, has been successfully improved, e.g., the trap density of the surface of the silicon film was decreased, etc.. Consequently the electron scattering density was lowered, which has for the first time made it possible to fabricate the thin film conducting layer. This point will be compared with the silicon film formed by the prior art for the purpose of evidencing the superiority of this invention.

As a first control, a silicon film was deposited at 600° C. by LPCVD, and then a dopant was added to a silicon film formed by the prior art with a silicon oxide film formed on by ECR-PECVD, and the activation was conducted at a low temperature of 300° C. to form a silicon film conducting layer. The dopant-added silicon film wiring was formed by the same process as in Example 6 except that the silicon film was deposited in a 263 Å-thickness using 12.50 SCCM of silane at 600° C., at a 9.2 mtorr reaction chamber interior pressure. The sheet resistance of the thus-prepared silicon film by the prior art was over 1 GΩ/square at all five measured positions. Actually no current flowed.

As a second control, a silicon film was formed using the heat-treatment at 600° C. by quite the same process as in Example 6, while oxide film was formed by APCVD, and then a dopant was added to the silicon film and the activation was conducted at a low temperature of 300° C. to form a silicon film conducting layer. The dopant-added silicon film wiring was formed by the same process as in Example 6 except that the silicon oxide film was deposited by APCVD in a 1500 Å-thickness keeping the substrate temperature at 300° C., and feeding together with the raw material gas 300 SCCM of the mixed gas of 20%-silane content nitrogen and silane, 420 SCCM of oxygen, and about 140 SLM of dilution nitrogen. The sheet resistance of the thus-prepared silicon film by the prior art was $(175\pm56)$K$\Omega$/square under 95% confidential level. Subsequently this substrate was again placed in the ECR-PECVD device for the hydrogen plasma treatment. The hydrogen plasma treatment was conducted using 125 SCCM of hydrogen at a 300° C. substrate temperature, a 2000 W microwave output and for 30 minutes. After the hydrogen plasma treatment, the resistance was measured at five positions on the substrate. The sheet resistance at two of the five positions was over 1 G$\Omega$/square, and the average value of the sheet resistances and the standard deviation at the remaining three positions were 158 k$\Omega$/square and 88 k$\Omega$/square, respectively.

Thus it can be understood that the coating of a silicon film heat-treated at a temperature equal to or lower than 600° C. with a silicon oxide film formed by an ECR-PECVD device realized, the formation of a silicon film with high film quality. Thus, a thin film semiconductor device having good characteristics can be fabricated by, as in Example 1, using the silicon film in the channel region, and using the silicon oxide film formed by an ECR-PECVD device as the gate insulating layer. Furthermore, a silicon film conducting layer of low resistance at low temperatures can be formed by, as in Example 6, adding dopant ions to the silicon film. Accordingly the silicon film according to this invention is effectively applicable not only to thin film semiconductor devices, but also to non-single crystal silicon films used in all electronic devices, such as gate electrodes and wirings of charge coupling devices (CCDs).

EXAMPLE 7

A dopant-added silicon film conducting layer was formed by the same process as in Example 6 except that the step of adding dopant ions to the silicon film by the bucket ion implanting system of non mass separation type was replaced by implanting monovalent phosphorus ions of a mass number of 31 by an ion implanting system of mass separation type. In Example 7, $3\times10^{15}$ 1/cm$^2$ of phosphorus ions were implanted at 90 kV. The resistance of the thus-prepared dopant-added silicon film was 1 G$\Omega$/square at five positions on the substrate, and substantially no current flowed. This results from the following reason. That is, because in Example 6 a dopant was added using a mixed gas of hydrogen and phosphine as the raw material gas by an ion implanting system of non mass separation type, inevitably hydrogen ions were added at the time of the implantation of the phosphorus atoms to the silicon film, and the defects generated at the time of the implantation were repaired by hydrogens. Only the combination of the silicon film of good quality according to this invention and the defects repaired by hydrogen can provide a silicon conducting layer of low resistance at low temperatures.

EXAMPLE 8

Figure 10A:
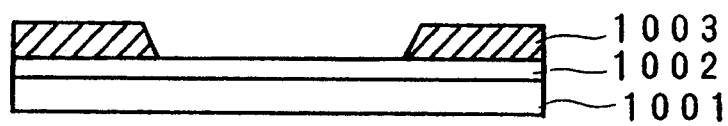
FIGS. 10A to 10D show sectional views of the silicon thin film semiconductor device according to an example of this invention in the respective fabrication steps.
Figure 10B:
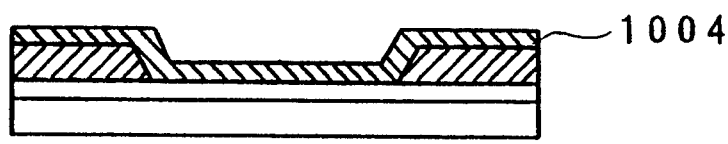
Figure 10C:
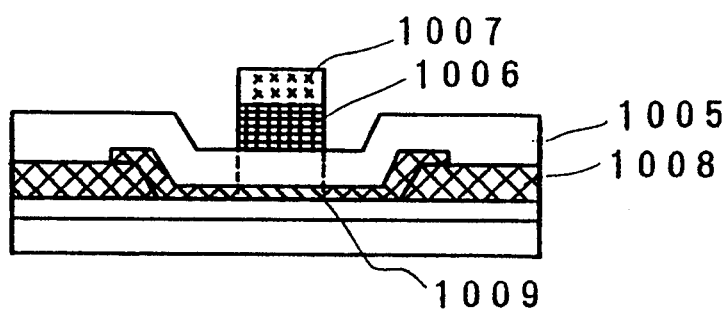

FIG. 10A to 10D show sectional views of the steps for fabricating a silicon thin film semiconductor device constituting a self-aligned staggered MIS field-effect transistor. First, as in Example 1, a substrate 1001 was cleaned, and then a SiO$_2$ film was deposited on the substrate in about 2000 Å as a protective underlayer film 1002. Then a first silicon film was deposited in about 1500 Å and was patterned to form a silicon film 1003 as a pad. (FIG. 10A). In Example 8, this first silicon film was deposited in 1500 Å by the LPCVD device used in the deposition of the channel silicon film in Example 1 using 12.5 SCCM of silane at a 600° C. depositing temperature. But it is possible that the first silicon film is deposited by the LPCVD device at a 550° C. depositing temperature, is deposited using disilane (Si$_2$H$_6$) as the raw material gas at a 450° C. depositing temperature, or is deposited by PECVD at about 250° C. depositing temperature. The first silicon film may be formed by any technique unless the film forming temperature exceeds the maximum processing temperature of 600° C. Subsequently a second silicon film 1004 was deposited. The first silicon film or a silicon film 1003 which is to be a pad is not necessary if the second silicon film is about 300 Å or more thick, and the resistance value at the source and the drain region after a dopant is added is sufficiently low compared with that of the channel region when the transistor is operated. In Example 8, the second silicon film 1004 was deposited by the same technique as that used in Example 1 in the deposition of the silicon thin film which was to be the channel region. That is, the second silicon film 1004 was deposited at the temperature of 550° C. in 250 Å by LPCVD using 100 SCCM of monosilane as the raw material gas with the deposition rate of 21.2 Å/min. Then the same heat-treatment as that conducted in Example 1 for the improvement of the crystallinity followed. That is, the heat-treatment was performed for 23 hours at 600° C. in a nitrogen ambient atmosphere (FIG. 10B). Then the second silicon film was patterned. Subsequently a gate insulating film 1005 was formed by the same technique as in Example 1. That is, a SiO$_2$ film was deposited in 1500 Å by ECR-PECVD. Then a metal film, etc. for electrodes were formed. In Example 8, as the gate electrode material a chrome film of a 2000 Å-thickness was used. The chrome film was formed by sputtering at a 180° C. substrate temperature. The resistance value immediately after formed was 994 m$\Omega$/square. Subsequently a SiO$_2$ film was deposited by APCVD on the chrome film in 3000 Å at a 300° C. depositing temperature and then patterned with a resist to form a gate electrode 1006, and a protective cap layer 1007 of the silicon film, and dopant ions were added. In Example 8, phosphorus was selected as the dopant for the purpose of fabricating on n-thin film semiconductor device. Other different elements may be selected in accordance with purposes. In Example 8 an ion implanting system without a mass separation analyzer was used to implant the dopant. The dopant was implanted using 5%-concentration phosphine diluted with hydrogen as the raw material gas at 110 kV acceleration voltage in a $5\times10^{15}$ 1/cm$^2$ concentration. Parts of the first and the second silicon films were formed into the source and the drain regions 1008, and because of the protective cap layer 1007 of the SiO$_2$ film, no dopant ions are added to the second silicon film below the cap layer 1007, and a channel region 1009 is constituted (FIG.

Figure 10D:
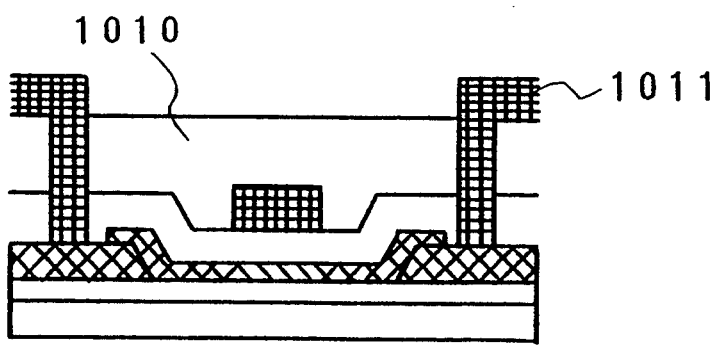

10C). Then the substrate was heat-treated for 2 hours in a nitrogen ambient atmosphere for the activation of the added dopant ions. Next, a SiO₂ film was deposited in 5000 Å as an inter-layer insulating film. Then contact holes were opened, and a wiring 1011 was formed of aluminum or others, and a self-aligned thin film semiconductor device was completed (FIG. 10D).

The transistor characteristics of the thus-fabricated self-aligned thin film semiconductor device were measured. With $L=W=10$ $\mu$m, $Vds=4$ V and $Vgs=10$ V, the ON-state current was 4.89 $\mu$A, the minimum value of the source-drain current was 0.21 pA with $Vgs=-3.5$ V, the OFF-state current was 2.85 pA with $Vgs=-10$ V, and the field effect mobility $\mu o=26.1$ cm²/v·sec. Thus, very good self-aligned thin film semiconductor device was obtained.

For comparison, a self-aligned thin film semiconductor device was fabricated by the same process as in Example 8 except that the channel silicon film was formed by LPCVD at 600° C. But, as elaborated in connection with Example 6, in the silicon film formed by the prior art added dopant ions in the thin film portion are not activated, and accordingly the resistance of the dopant-added silicon film of the thin film portion is adversely so high that impractically the ON-state current of the transistor was 47.9 pA. In contrast to this, Example 8 omitted the hydrogen plasma treatment which is a main cause for deflections of the characteristics, and has succeeded in fabricating a very good self-aligned thin film semiconductor device at low temperatures. This is a fruit resulting from that, as in Example 2, the thickness of a channel silicon film semiconductor layer is thinned to below 500 Å to thereby improve the basic semiconductor characteristics, and besides as in Example 6, a thin film conducting silicon film is formed, whereby a source and a drain regions of a thin film can be formed easily at low temperatures. That is, it has been conventionally impossible to activate dopants as donors or acceptors without heat-treating a silicon film of an about 1000 Å-thickness at temperatures above about 550° C. Accordingly the self-aligned thin film semiconductor device conventionally has had the channel region whose film thickness is above about 1000 Å and has had poor characteristics. Furthermore, after the gate insulating layer and the gate electrode are completed, the heat-treatment at a temperature above about 550° C. has been performed for the activation of the added dopant ions. This has deteriorated the film quality of the gate insulating film, and accordingly the hydrogen treatment has been essential. Since it has been impossible to use a metal material as the gate electrode, the resistance of the gate wiring has been high, or it has been necessary to form the gate electrode and the gate wiring independently. But according to this invention, a metal material can be used as the gate electrode, and the hydrogen treatment which is a main cause for the deflections can be omitted. Consequently this invention has succeeded in fabricating thin film semiconductor device of high characteristics stably by the easier process.

As described above, according to this invention, a silicon film is deposited on a substrate having the surface formed of an insulative material, and after this silicon film is heat-treated at about 600° C., a silicon oxide film is deposited thereon by ECR-PECVD, whereby the film quality of the silicon film can be improved. For example, the transistor characteristics of thin film semiconductor devices can be drastically improved by the process according to this invention for fabricating a thin film semiconductor device which comprises the step depositing a channel silicon film and the step of heat-treating the channel silicon film at 600° C., following the heat-treatment, or the process according to this invention for fabricating a thin film semiconductor device which comprises the step of depositing an amorphous silicon film constituting the channel silicon semiconductor layer, the step of radiating an oxygen plasma to and heat-treating the amorphous silicon film a temperature equal to or lower than 600° C. before the formation of a gate insulating layer. At the same time, this invention enables a number of such thin film semiconductor devices having good transistor characteristics to be fabricated homogeneously on a large area. This produces the great effects of realizing multi-layer LSIs, and inexpensive active matrix liquid crystal displays of higher performance.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A process for fabricating a semiconductor device comprising:
    a first step of forming a silicon film on a substrate having at least a surface formed of an insulative material;
    a second step of heat-treating the silicon film formed on the substrate at a temperature below 600° C. after said first step;
    a third step of forming a silicon oxide film on the heat-treated silicon film by electron cyclotron resonance CVD after said second step; and
    a fourth step of implanting a dopant as donor or acceptor into the silicon film by a bucket type ion implantation system of non-mass separation type, using a mixed gas of a hydride of the dopant and hydrogen after said third step.

2. A process for fabricating a semiconductor device according to claim 1,
    wherein the fourth step is to form a gate electrode on the silicon oxide film which will be a gate insulating film of a thin film transistor, and is to form a source region and a drain region with the gate electrode being a mask.

* * * * *